US012803390B2

(12) United States Patent
Sato et al.

(10) Patent No.: US 12,803,390 B2
(45) Date of Patent: Nov. 17, 2026

(54) MOTOR-DRIVEN COMPRESSOR

(71) Applicant: KABUSHIKI KAISHA TOYOTA JIDOSHOKKI, Aichi-ken (JP)

(72) Inventors: Ryutaro Sato, Kariya (JP); Kazuhiro Shiraishi, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 125 days.

(21) Appl. No.: 19/043,626

(22) Filed: Feb. 3, 2025

(65) Prior Publication Data

US 2025/0253742 A1 Aug. 7, 2025

(30) Foreign Application Priority Data

Feb. 7, 2024 (JP) ................................ 2024-016977

(51) Int. Cl.
*H02K 11/02* (2016.01)
*B60H 1/32* (2006.01)
(Continued)

(52) U.S. Cl.
CPC ........... *H02K 11/02* (2013.01); *B60H 1/3222* (2013.01); *F25B 31/026* (2013.01); *H02K 11/33* (2016.01); *H03H 1/0007* (2013.01)

(58) Field of Classification Search
CPC .. B60H 1/3222; H03H 1/0007; H03H 7/0115; H02K 2211/03; H02K 11/02; H02K 11/022; H02K 11/042; H02K 11/048; H02K 11/049; H02K 11/05; H02K 11/33; H02K 11/225; H02K 11/30; F25B 31/026;
(Continued)

(56) References Cited

U.S. PATENT DOCUMENTS 5,195,232 A * 3/1993 Frederick ............ H05K 9/0066 29/855
5,528,205 A * 6/1996 Wong .................. H03H 1/0007 336/219
(Continued)

FOREIGN PATENT DOCUMENTS

DE 102019204141 A1 * 10/2019 ............ H02M 1/126
JP 2021-168561 A 10/2021
(Continued)

*Primary Examiner* — Maged M Almawri

(74) *Attorney, Agent, or Firm* — Greenblum & Bernstein, P.L.C.

(57) ABSTRACT

A conductor includes a first metal plate and a second metal plate. The first metal plate includes a body arranged on a side of two windings opposite to the second metal plate, and two extensions extending from the body toward the second metal plate. The second metal plate includes two opposing portions respectively opposed to the two extensions, and a coupling portion that couples the two opposing portions to each other. The conductor includes weld portions in which the opposing portions are respectively welded to the extensions. A housing has a groove in which each of the weld portions and the coupling portion are arranged. A heat dissipation material is provided in the groove to transfer heat generated from the weld portion and the coupling portion to the housing. An induced current flows through the weld portion and the coupling portion arranged in the groove.

3 Claims, 6 Drawing Sheets

(51) Int. Cl.
*F25B 31/02* (2006.01)
*H02K 11/33* (2016.01)
*H03H 1/00* (2006.01)

(58) Field of Classification Search
CPC F25B 2600/021; H02P 27/06; F04C 2240/30; F04C 2240/403; F04C 2240/803; F04C 2240/808; F04C 23/02; F04C 18/0215; F04C 18/34; F04C 29/0085; F04C 29/04; F04B 35/04; H02M 1/44; H02M 1/143
USPC .......................................... 310/72; 417/410.1
See application file for complete search history.

(56) References Cited

U.S. PATENT DOCUMENTS

| | | | | |
|---|---|---|---|---|
| 10,897,183 | B2 * | 1/2021 | Ambo | H01F 27/346 |
| 11,611,265 | B2 * | 3/2023 | Yamamoto | H02K 11/02 |
| 12,293,862 | B2 * | 5/2025 | Ito | H01F 17/062 |
| 2011/0163705 | A1 * | 7/2011 | Sato | H02K 11/026 318/400.24 |
| 2018/0198350 | A1 * | 7/2018 | Ambo | H03H 7/0115 |
| 2019/0305648 | A1 * | 10/2019 | Ambo | H02K 11/0094 |
| 2021/0091699 | A1 * | 3/2021 | Nagata | H02M 1/44 |
| 2021/0301803 | A1 * | 9/2021 | Ambo | H01F 27/2895 |
| 2021/0320566 | A1 * | 10/2021 | Yamamoto | H02K 5/06 |
| 2024/0145152 | A1 * | 5/2024 | Ito | H01F 17/062 |
| 2025/0253742 | A1 * | 8/2025 | Sato | F25B 31/026 |
| 2025/0392210 | A1 * | 12/2025 | Takatsuji | H02M 1/44 |

FOREIGN PATENT DOCUMENTS

| | | | | |
|---|---|---|---|---|
| WO | WO-2022138217 A1 * | 6/2022 | | H02M 1/4208 |
| WO | WO-2023238190 A1 * | 12/2023 | | H05K 9/0007 |

* cited by examiner

MOTOR-DRIVEN COMPRESSOR

CROSS-REFERENCE TO RELATED APPLICATIONS

This application is based upon and claims the benefit of priority from Japanese Patent Application No. 2024-016977, filed on Feb. 7, 2024, the entire contents of which are incorporated herein by reference.

BACKGROUND

1. Field

The present disclosure relates to a motor-driven compressor.

2. Description of Related Art

Motor-driven compressors include a housing, a compression unit, a motor, and an inverter device. The housing accommodates the compression unit, the motor, and the inverter device. The compression unit compresses fluid. The motor drives the compression unit. The inverter device is accommodated in the housing, which is made of metal. The inverter device drives the motor.

The inverter device includes an inverter circuit unit and a noise reducing unit. The inverter circuit unit converts DC power into AC power. The noise reducing unit is located on the input side of the inverter circuit unit. The noise reducing unit reduces common-mode noise and normal-mode noise that are included in the DC power input to the inverter circuit unit. The noise reducing unit includes a common-mode choke coil and a smoothing capacitor. The smoothing capacitor forms a low-pass filter circuit together with the common-mode choke coil. The common-mode choke coil includes an annular core, two windings wound around the core, and an annular conductor that surrounds the two windings. The conductor is configured such that an induced current flows circumferentially to resist changes in a leakage magnetic flux from the core.

Japanese Laid-Open Patent Publication No. 2021-168561 discloses an example of a motor-driven compressor that includes an annular metal plate serving as a conductor. The metal plate includes a first metal plate and a second metal plate into which the metal plate is split in the circumferential direction. The first metal plate includes a body and two upright sections bent to extend from two ends of the body, respectively. The body of the first metal plate has a through-hole.

The second metal plate includes a body and two upright sections bent to extend from two ends of the body, respectively. The two upright sections of the first metal plate each have a tip. On the tip side, the body and the upright sections of the second metal plate are located between the upright sections of the first metal plate. The upright sections of the first and second metal plates are welded to each other, resulting in the metal plates being formed into an annular shape.

The first metal plate is located such that the body is in contact with the housing. Further, the first metal plate is located between the housing and the two windings. In addition, a heat dissipation member is arranged in the through-hole of the body. The second metal plate is electrically connected to the first metal plate. Further, the second metal plate is located between the circuit board and the two windings.

In the above-described publication, when an induced current flows in the circumferential direction of the metal plate, the metal plate generates heat. In this state, weld portions in which the upright sections of the first and second metal plates are welded to each other also generate heat. The second metal plate, which spans between the weld portions, tends to reach a relatively high temperature as it absorbs heat from the weld portions.

SUMMARY

This Summary is provided to introduce a selection of concepts in a simplified form that are further described below in the Detailed Description. This Summary is not intended to identify key characteristics or essential characteristics of the claimed subject matter, nor is it intended to be used as an aid in determining the scope of the claimed subject matter.

A motor-driven compressor according to an aspect of the present disclosure includes a compression unit configured to compress fluid, an electric motor configured to drive the compression unit, an inverter device configured to drive the electric motor, and a metal housing that accommodates the compression unit, the electric motor, and the inverter device. The inverter device includes an inverter circuit unit configured to convert DC power to AC power, and a noise reducing unit arranged on an input side of the inverter circuit unit and configured to reduce common-mode noise and normal-mode noise. The common-mode noise and normal-mode noise are included in the DC power that is input to the inverter circuit unit. The noise reducing unit includes a common-mode choke coil and a smoothing capacitor that forms a low-pass filter together with the common-mode choke coil. The common-mode choke coil includes an annular core, two windings wound around the core, and an annular conductor that surrounds the two windings. The conductor is configured such that an induced current flows circumferentially to resist changes in a leakage magnetic flux from the core. The conductor includes a first metal plate and a second metal plate. The first metal plate includes a body arranged on a side of the two windings opposite to the second metal plate, and two extensions extending from the body toward the second metal plate. The second metal plate includes two opposing portions respectively opposed to the two extensions, and a coupling portion that couples the two opposing portions to each other. The conductor includes weld portions in which the opposing portions are respectively welded to the extensions. The housing has a groove in which each of the weld portions and the coupling portion are arranged. A heat dissipation material is provided in the groove to transfer heat generated from the weld portion and the coupling portion to the housing. The induced current flows through the weld portion and the coupling portion arranged in the groove.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

A motor-driven compressor according to an embodiment will now be described with reference to FIGS. 1 to 8. The motor-driven compressor of the present embodiment is employed in, for example, a vehicle on-board air conditioner.

Figure 1:
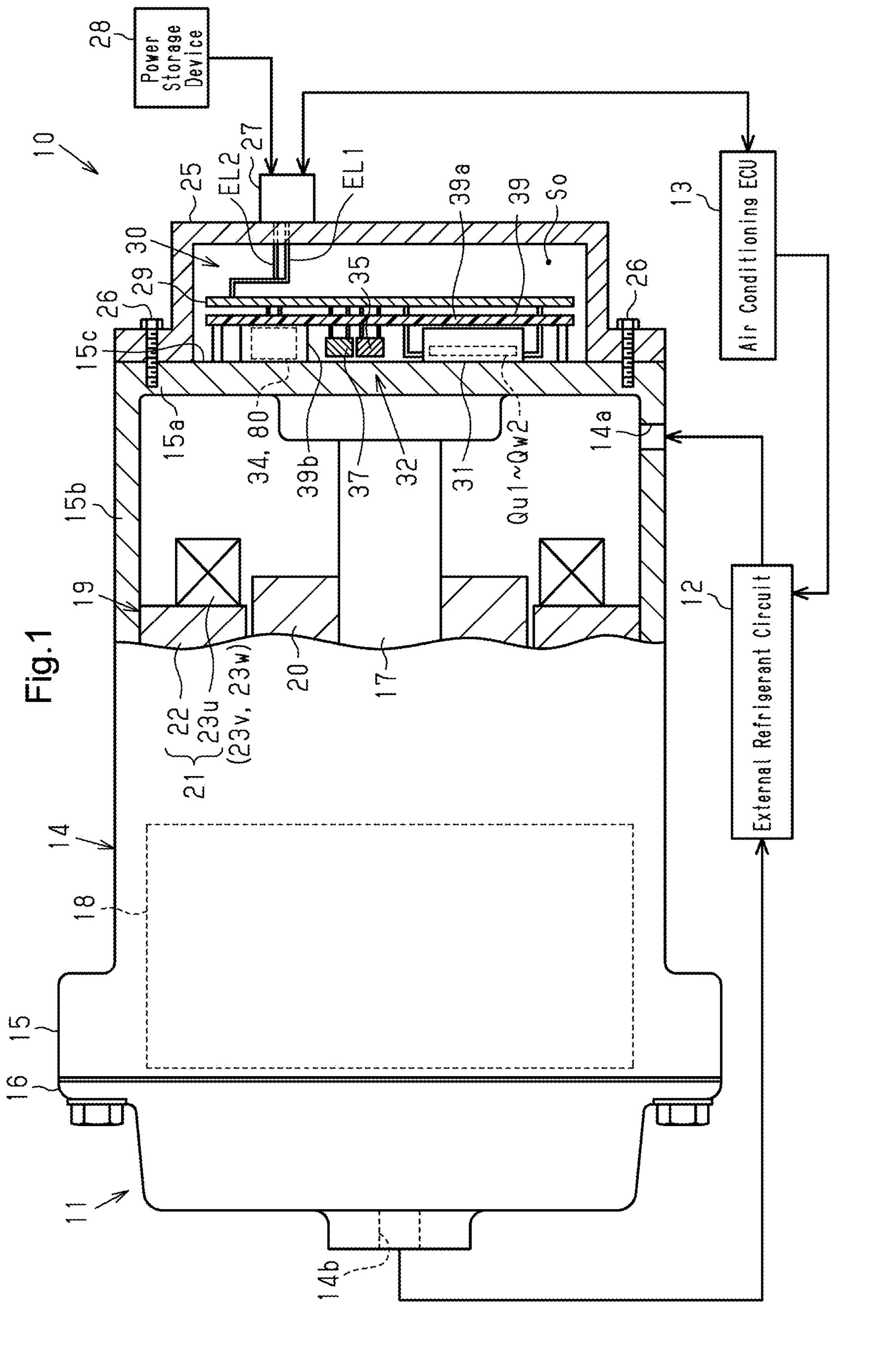
FIG. 1 is a cross-sectional view, with a part cut away, illustrating a motor-driven compressor.

As shown in FIG. 1, the vehicle on-board air conditioner 10 includes a motor-driven compressor 11 and an external refrigerant circuit 12. The external refrigerant circuit 12 includes, for example, a heat exchanger and an expansion valve, which are not illustrated in the drawings. The motor-driven compressor 11 compresses refrigerant, which is fluid, and the external refrigerant circuit 12 performs heat exchange of the refrigerant and expands the refrigerant. This allows the vehicle on-board air conditioner 10 to cool or warm the passenger compartment.

The vehicle on-board air conditioner 10 includes an air conditioning ECU 13 that controls the entire vehicle on-board air conditioner 10. The air conditioning ECU 13 obtains the temperature of the passenger compartment, a target temperature of the passenger compartment that is set by a user, and the like. Based on the parameters including the temperature of the passenger compartment and the target temperature, the air conditioning ECU 13 transmits various types of instructions, such as an ON-OFF instruction, to the motor-driven compressor 11.

Motor-Driven Compressor

The motor-driven compressor 11 includes a housing 14, a rotary shaft 17, a compression unit 18 that compresses refrigerant, an electric motor 19 that drives the compression unit 18, and an inverter device 30 that drives the electric motor 19.

The housing 14 is made of a metal material that has thermal conductivity, such as aluminum. The housing 14 is grounded to the body of the vehicle.

The housing 14 includes a suction housing member 15, a discharge housing member 16, and an inverter housing member 25 that are coupled to each other. The suction housing member 15 is cylindrical in shape, with one end closed. The suction housing member 15 includes a plate-shaped end wall 15*a* and a circumferential wall 15*b* that extends upright in a tubular form from a peripheral edge of the end wall 15*a* toward the discharge housing member 16.

Figure 3:
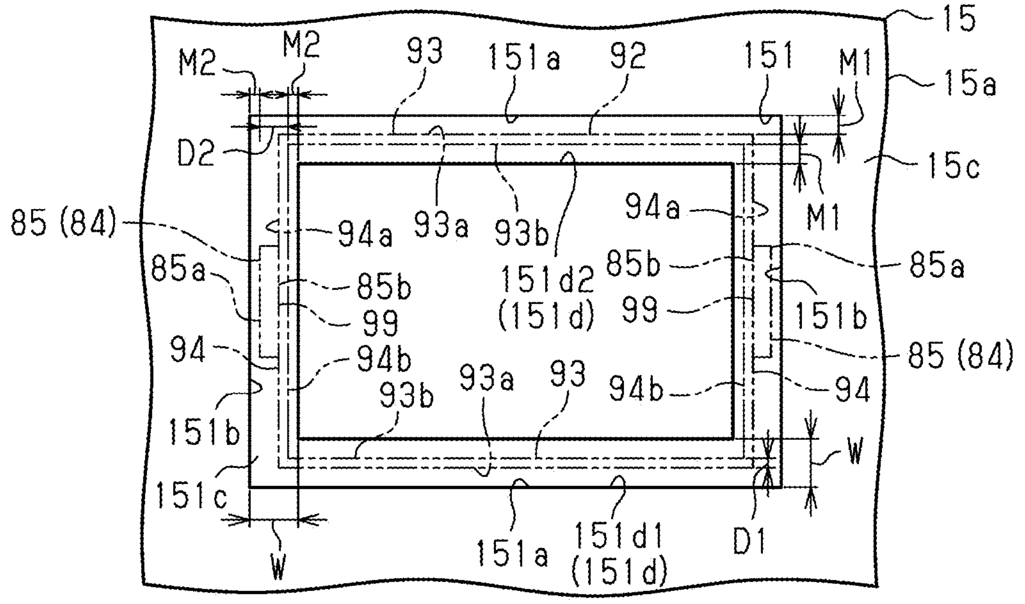
FIG. 3 is a plan view illustrating the groove in the end wall of the motor-driven compressor shown in FIG. 1.

As shown in FIG. 3, the end wall 15*a* of the suction housing member 15 has a groove 151 that is recessed from an outer surface 15*c* of the end wall 15*a*. The groove 151 has the shape of an elongated rectangular frame. The groove 151 includes two long groove portions 151*a* and two short groove portions 151*b*.

Figure 7:
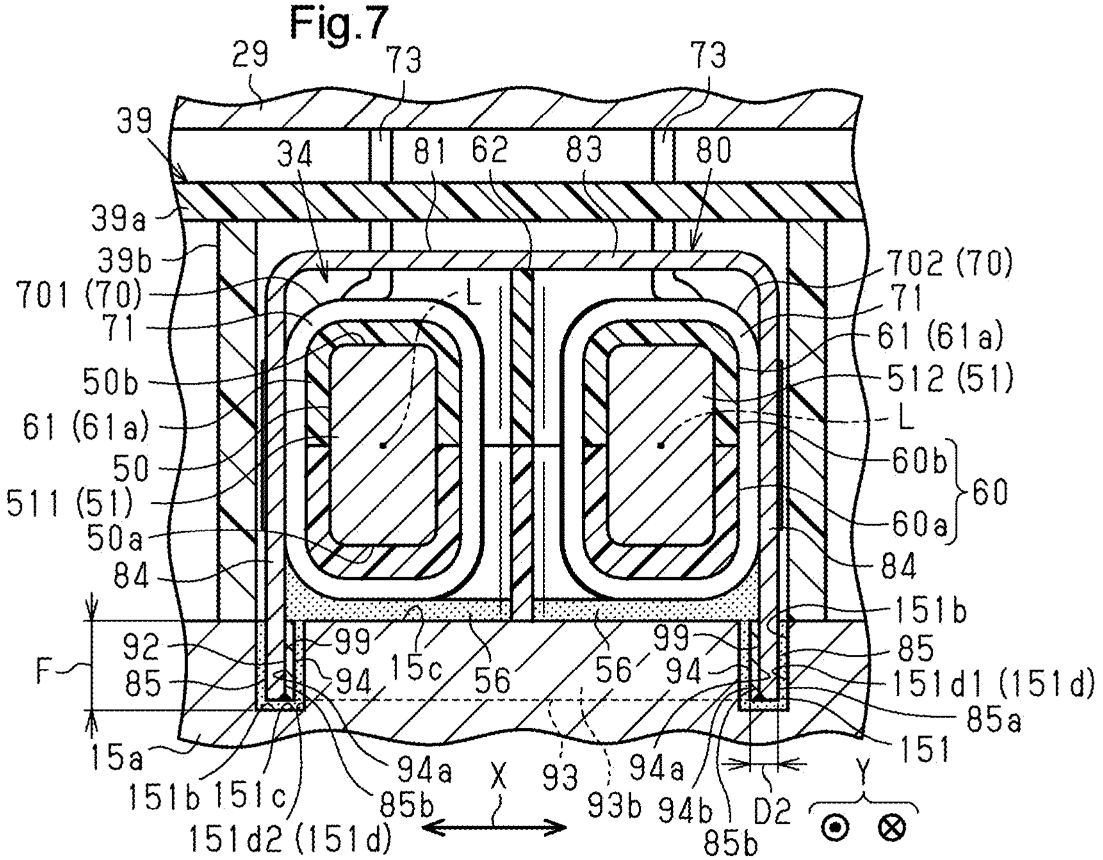
FIG. 7 is a cross-sectional view illustrating part of the motor-driven compressor shown in FIG. 1.
Figure 8:
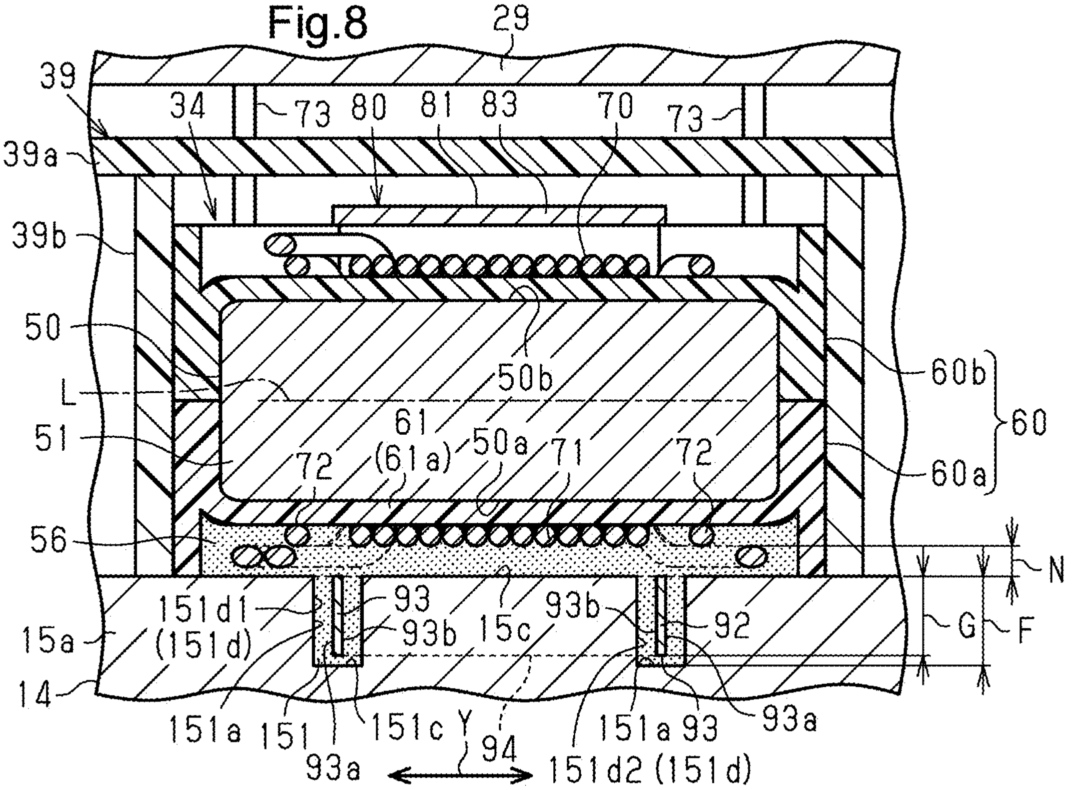
FIG. 8 is a cross-sectional view illustrating part of the motor-driven compressor shown in FIG. 1.

The groove 151 is defined by two inner side surfaces 151*d* that are continuous with the outer surface 15*c* of the end wall 15*a*, and an inner bottom surface 151*c* that is continuous with each inner side surface 151*d* and is a bottom surface of the groove 151. The shortest distance between the two inner side surfaces 151*d* is defined as an opening width W. The opening width W of the groove 151 in the long groove portion 151*a* is equal to the opening width W of the groove 151 in the short groove portion 151*b*. As shown in FIGS. 7 and 8, the groove 151 has the same depth F in the long groove portion 151*a* and the short groove portion 151*b*. The depth F of the groove 151 is the shortest distance from the outer surface 15*c* of the end wall 15*a* to the inner bottom surface 151*c* of the groove 151.

As shown in FIG. 1, the discharge housing member 16 is coupled to the suction housing member 15 while closing the opening of the suction housing member 15. Thus, an internal space is defined in the housing 14.

The housing 14 has a suction port 14*a* into which refrigerant is drawn from the external refrigerant circuit 12. The suction port 14*a* is located in the circumferential wall 15*b* of the suction housing member 15. The housing 14 has a discharge port 14*b* from which refrigerant is discharged to the external refrigerant circuit 12. The discharge housing member 16 has the discharge port 14*b*.

The inverter housing member 25 is cylindrical in shape, with one end closed. The inverter housing member 25 is attached to the end wall 15*a* using bolts 26, with the opening end of the inverter housing member 25 in contact with the end wall 15*a*. The opening of the inverter housing member 25 is closed by the end wall 15*a*. The inverter housing member 25 and the end wall 15*a* define an accommodation chamber So.

A connector 27 is coupled to the inverter housing member 25. The connector 27 is electrically connected to a power storage device 28 that is mounted on the vehicle. The power storage device 28 is a DC power supply mounted on the vehicle and is, for example, a rechargeable battery or a capacitor.

The housing 14 accommodates a rotary shaft 17, a compression unit 18, and an electric motor 19. The accommodation chamber So of the housing 14 accommodates an inverter device 30. Thus, the housing 14 accommodates the compression unit 18, the electric motor 19, and the inverter device 30.

The rotary shaft 17 is rotationally supported by the housing 14. The rotary shaft 17 is arranged such that its axial direction coincides with the thickness direction of the end wall 15*a*.

The compression unit 18 compresses the refrigerant that has been drawn in from the suction port 14*a* by the rotation of the rotary shaft 17, and discharges the compressed refrigerant from the discharge port 14*b*. The compression unit 18 may be of any type, such as a scroll type, a piston type, or a vane type.

The electric motor 19 is located between the compression unit 18 and the end wall 15*a* in the axial direction of the rotary shaft 17. The electric motor 19 rotates the rotary shaft 17 to drive the compression unit 18. The electric motor 19 includes a rotor 20 fixed to the rotary shaft 17, and a stator 21 fixed to the housing 14. The stator 21 includes a cylindrical stator core 22. The stator 21 also includes a U-phase coil 23*u*, a V-phase coil 23*v*, and a W-phase coil 23*w*, all wound around the stator core 22. The stator core 22 is fixed to the inner circumferential surface of the circumferential wall 15*b* of the suction housing member 15. The u-phase coil 23*u*, the v-phase coil 23*v*, and the w-phase coil 23*w* are connected to form, for example, a Y-connection. The connection configuration of the u-phase coil 23*u*, the v-phase coil 23*v*, and the w-phase coil 23*w* is not limited to a Y-connection and may be, for example, a delta connection.

The rotor 20 rotates when the u-phase coil 23*u*, the v-phase coil 23*v*, and the w-phase coil 23*w* are energized in a predetermined pattern. As the rotor 20 rotates, the rotary shaft 17 rotates. As a result, the compression unit 18 is driven.

Inverter Device

Figure 2:
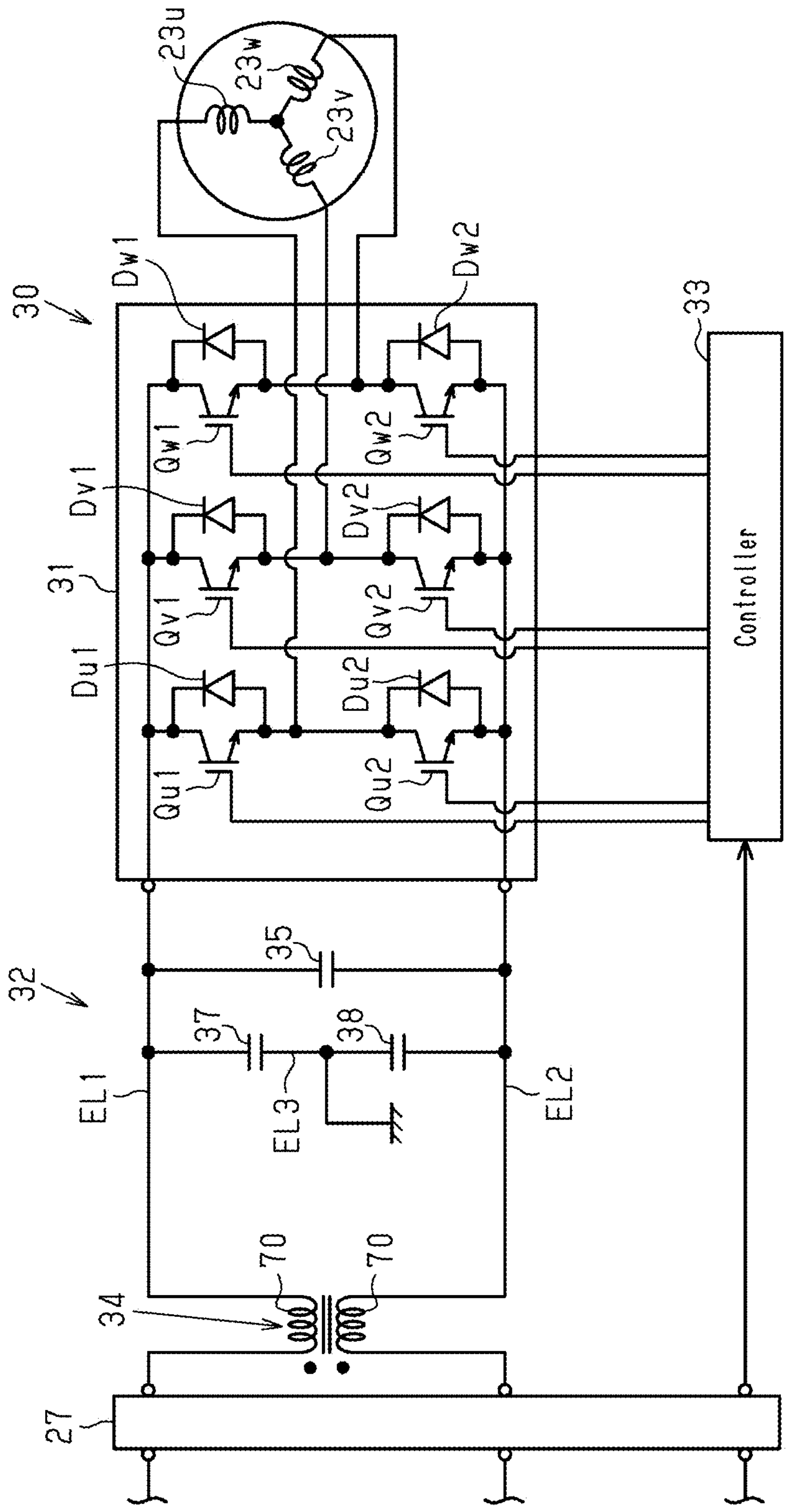
FIG. 2 is a circuit diagram of the electric motor of the motor-driven compressor shown in FIG. 1.

As shown in FIG. 1, the inverter device 30 includes an inverter circuit unit 31 and a noise reducing unit 32. The inverter device 30 includes a controller 33, which is shown in FIG. 2, and a holder 39. The inverter circuit unit 31 converts DC power into AC power.

As shown in FIG. 1, the inverter circuit unit 31 includes a plate-shaped circuit board 29. The circuit board 29 is located relative to the end wall 15*a* at a predetermined distance in the axial direction of the rotary shaft 17.

The holder 39 is made of plastic. The holder 39 is located between the circuit board 29 and the end wall 15*a* of the suction housing member 15. The holder 39 includes a plate portion 39*a* and a tubular portion 39*b*. The thickness direction of the plate portion 39*a* coincides with the thickness direction of the circuit board 29. The tubular portion 39*b* extends from the plate portion 39*a* toward the end wall 15*a*.

The inverter circuit unit 31 is held by the plate portion 39*a* of the holder 39 and mounted on the circuit board 29. The inverter circuit unit 31 includes two connection lines EL1 and EL2.

As shown in FIG. 2, the inverter circuit 31 includes u-phase switching elements Qu1 and Qu2 corresponding to the u-phase coil 23*u*, *v*-phase switching elements Qv1 and Qv2 corresponding to the v-phase coil 23*v*, and w-phase switching elements Qw1 and Qw2 corresponding to the w-phase coil 23*w*. Each of the switching elements Qu1 to Qw2 is, for example, a power switching element such as an IGBT. The switching elements Qu1 to Qw2 include free-wheeling diodes (body diodes) Du1 to Dw2.

The u-phase switching elements Qu1 and Qu2 are connected to each other in series by a connection line, and the connection line is connected to the u-phase coil 23*u*. The serially-connected body of the u-phase switching elements Qu1 and Qu2 is electrically connected to the connection lines EL1 and EL2. Further, the serially-connected body receives DC power from the power storage device 28.

Except for the corresponding coil, the other switching elements Qv1, Qv2, Qw1, and Qw2 are connected in the same manner as the u-phase switching elements Qu1 and Qu2.

The controller 33 controls switching operations of the switching elements Qu1 to Qw2. The controller 33, which is processing circuitry, may include, for example, at least one dedicated hardware circuit and/or at least one processor that operates in accordance with a computer program. The processor includes a CPU and memory such as a RAM and ROM. The memory stores program codes or commands configured to cause the processor to execute various processes. The memory, or a computer-readable medium, includes any type of medium that is accessible by general-purpose computers and dedicated computers.

The controller 33 is electrically connected to the air conditioning ECU 13 by the connector 27. Based on commands from the air conditioning ECU 13, the controller 33 periodically turns on and off the switching elements Qu1 to Qw2. Specifically, based on the commands from the air conditioning ECU 13, the controller 33 performs pulse-width modulation (PWM) control on the switching elements Qu1 to Qw2. More specifically, the controller 33 uses a carrier signal (carrier wave signal) and a commanded voltage value signal (signal for comparison) to generate control signals. Further, the controller 33 uses the generated control signals to perform ON-OFF control of the switching elements Qu1 to Qw2, thereby converting DC power to AC power.

As shown in FIG. 1, the noise reducing unit 32 is arranged on the input side of the inverter circuit unit 31. The noise reducing unit 32 reduces common-mode noise and normal-mode noise included in the DC power that is input to the inverter circuit 31. Specifically, the noise reducing unit 32 includes a common-mode choke coil 34, which is mounted on the circuit board 29, and a smoothing capacitor 35. The smoothing capacitor 35 forms a low-pass filter together with the common-mode choke coil 34. The noise reducing unit 32 includes a conductor 80 and two Y-capacitors 37 and 38. The low-pass filter is provided on the connection lines EL1 and EL2. The low-pass filter is provided between the connector 27 and the inverter circuit unit 31 in the circuit configuration.

As shown in FIG. 2, the common-mode choke coil 34 is provided on the two connection lines EL1 and EL2. The smoothing capacitor 35 is provided between the common-mode choke coil 34 and the inverter circuit unit 31. The smoothing capacitor 35 is electrically connected to the two connection lines EL1 and EL2. The common-mode choke coil 34 and the smoothing capacitor 35 form an LC resonance circuit. That is, the low-pass filter of the present embodiment is an LC resonance circuit including the common-mode choke coil 34.

The two Y-capacitors 37 and 38 are connected in series to each other. A bypass line EL3 that connects one end of the Y-capacitor 37 to one end of the other Y-capacitor 38 is grounded to the body of the vehicle.

The serially-connected body of the two Y-capacitors 37 and 38 is provided between the common-mode choke coil 34 and the smoothing capacitor 35 and is electrically connected to the common-mode choke coil 34.

Common-Mode Choke Coil

The common-mode choke coil 34 limits transmission of high-frequency noise generated in the vehicle to the inverter circuit unit 31 of the motor-driven compressor 11.

The common-mode choke coil 34 reduces common-mode noise. Further, the common-mode choke coil 34 uses the leakage inductance as a normal inductance. As a result, the common-mode choke coil 34 is used as an L component in the low-pass filter, which eliminates normal-mode noise (differential-mode noise). That is, the common-mode choke coil 34 can handle common-mode noise and normal-mode noise. Accordingly, the motor-driven compressor 11 uses the common-mode choke coil 34 to handle common-mode noise and normal-mode noise, instead of individually using a choke coil for common mode and a choke coil for normal mode.

Figure 4:
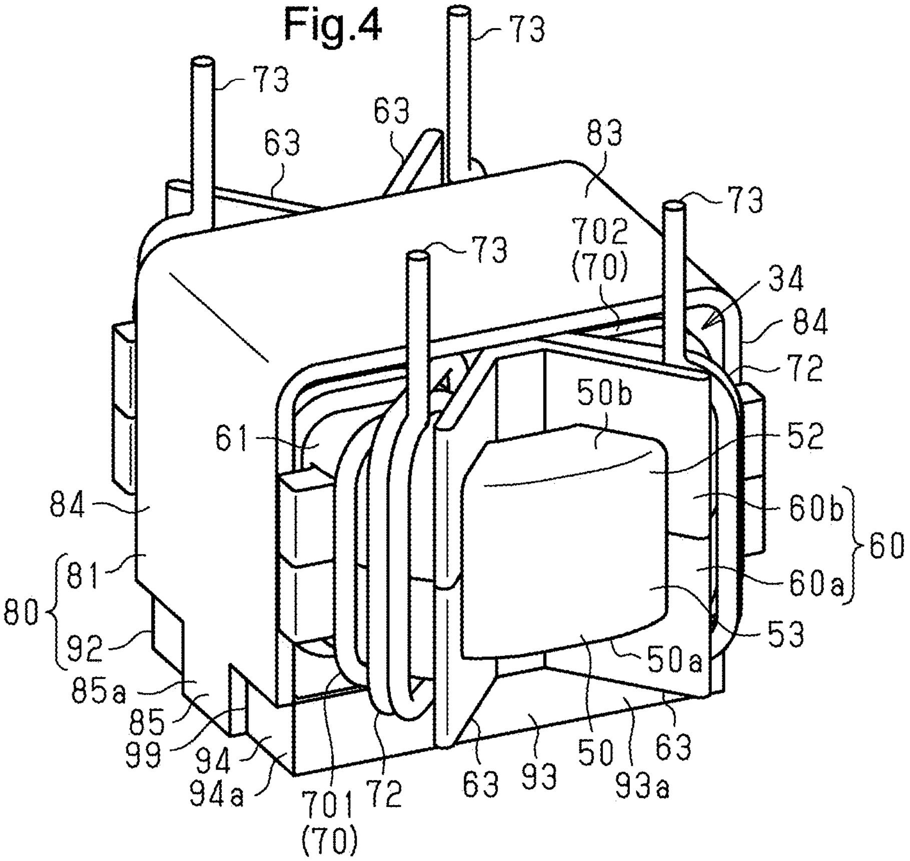
FIG. 4 is a perspective view illustrating the common-mode choke coil and the conductor of the motor-driven compressor shown in FIG. 1.
Figure 5:
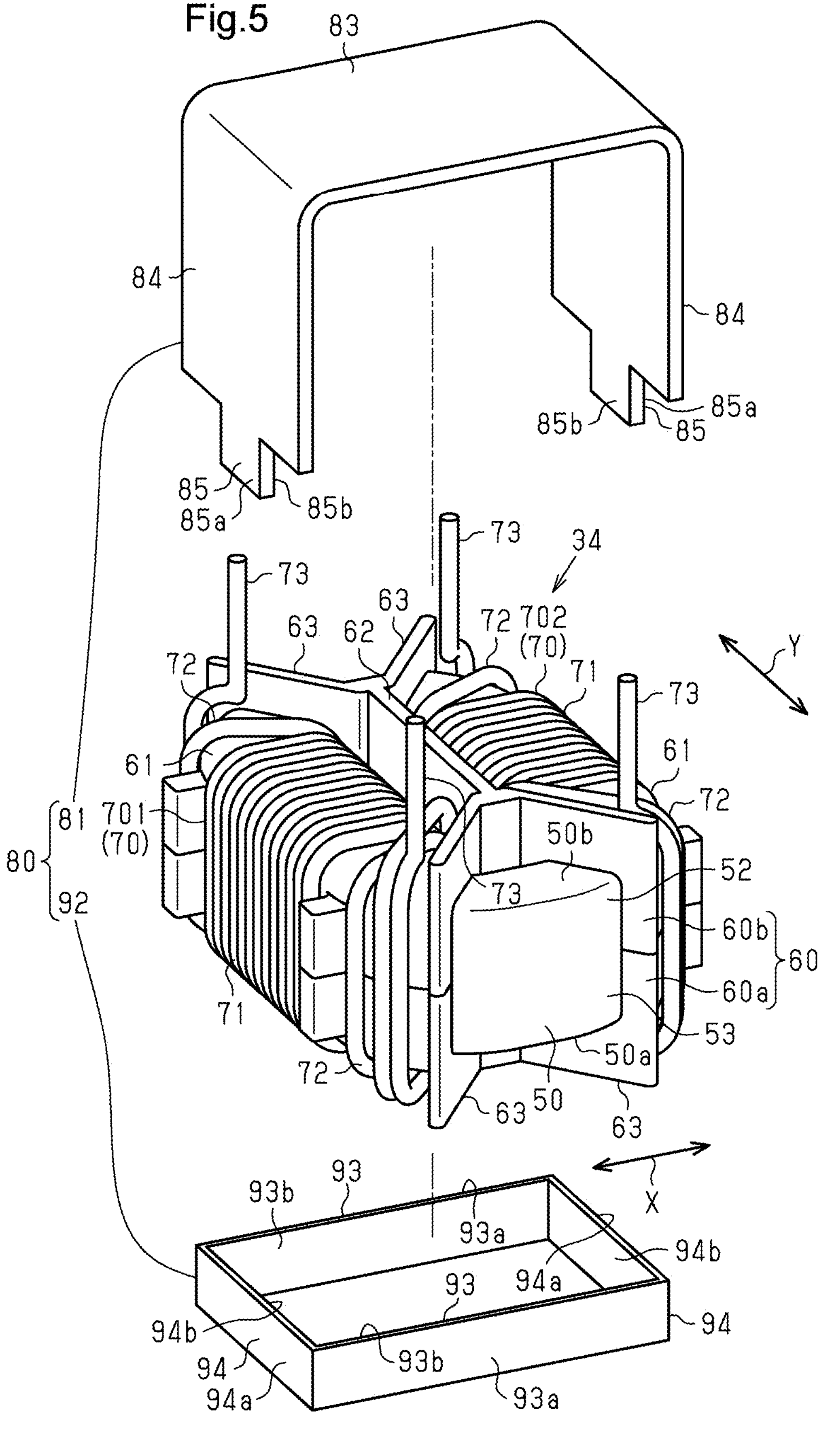
FIG. 5 is an exploded perspective view illustrating the common-mode choke coil and the conductor of the motor-driven compressor shown in FIG. 1.

As shown in FIGS. 4 and 5, the common-mode choke coil 34 includes an annular core 50, an insulating member 60 that accommodates the core 50, two windings 70 wound around the core 50 via the insulating member 60, and an annular conductor 80 that surrounds the two windings 70. The core 50 has the shape of an endless loop. The conductor 80 is configured such that an induced current flows circumferentially to resist changes in a leakage magnetic flux from the core 50.

The two windings 70 are wound around the insulating member 60 accommodating the core 50. The two windings 70 are surrounded by the conductor 80. The core 50 is formed of a ferromagnetic material. The core 50 is, for example, a ferrite core. In the following description, one of the two windings 70 may be referred to as a first winding 701, and the other may be referred to as a second winding 702.

Figure 6:
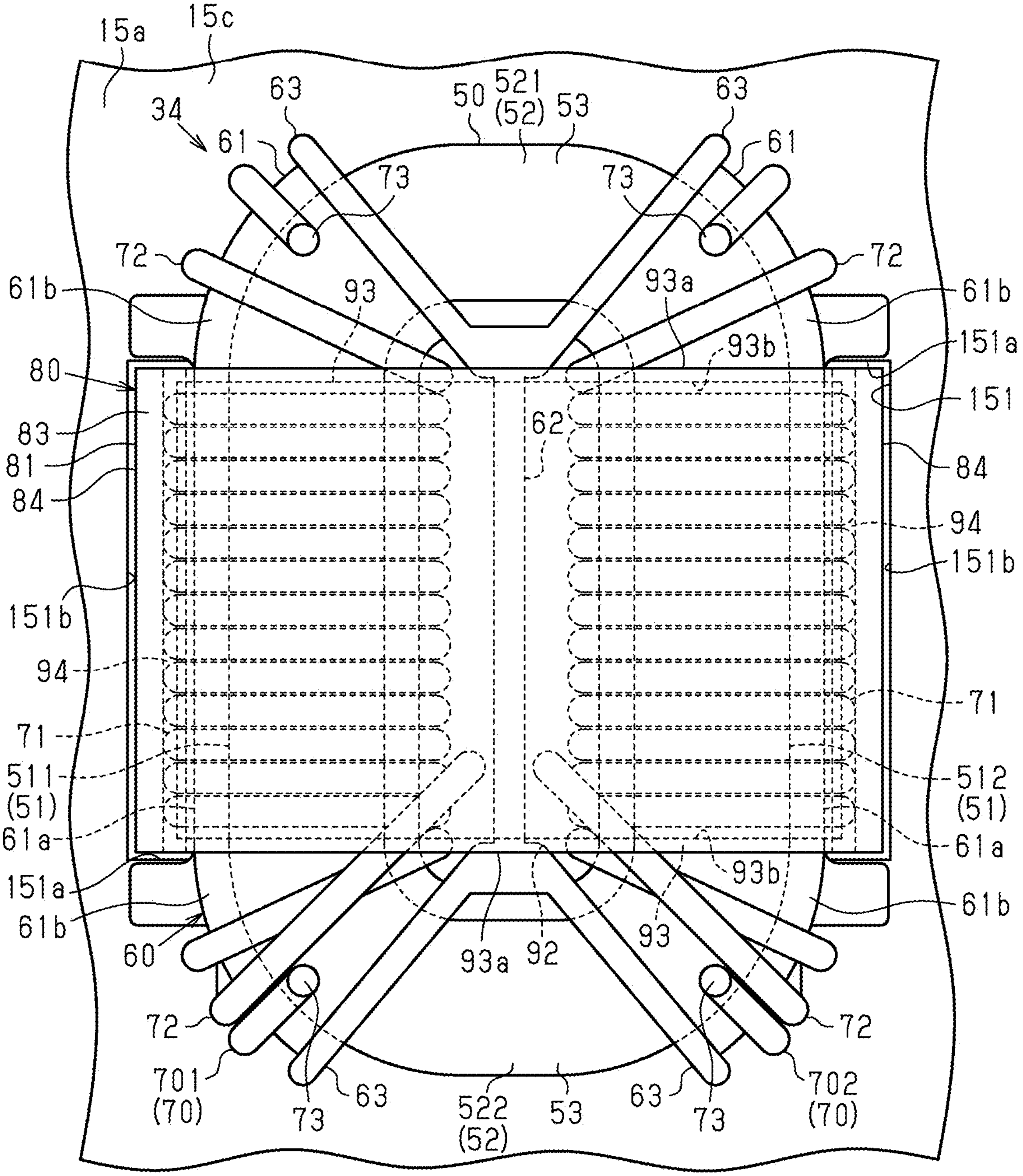
FIG. 6 is a plan view illustrating the common-mode choke coil and the conductor of the motor-driven compressor shown in FIG. 1.

As shown in FIG. 6, the core 50 has a stadium-shaped, annular configuration. The core 50 includes two linear sections 51 and two arcuate sections 52.

In the following description, one of the two linear sections 51 may be referred to as a first linear section 511, and the other may be referred to as a second linear section 512. Further, one of the two arcuate sections 52 may be referred to as a first arcuate section 521, and the other may be referred to as a second arcuate section 522.

The linear sections 51 each extend linearly. The two linear sections 51 extend parallel to each other. The arcuate sections 52 each extend arcuately. The two arcuate sections 52 connect the corresponding ends of the two linear sections 51 to each other. Specifically, the first arcuate section 521 connects one end of the first linear section 511 to one end of the second linear section 512, and the second arcuate section 522 connects the other end of the first linear section 511 to the other end of the second linear section 512.

As shown in FIGS. 7 and 8, the core 50 has a first end face 50*a* and a second end face 50*b*. The first end face 50*a* is one end face of the core 50 in the axial direction of the core 50, and the second end face 50*b* is the other end face of the core 50 in the axial direction of the core 50.

Of the two windings 70, the first winding 701 is wound around the first linear section 511, and the second winding 702 is wound around the second linear section 512.

As shown in FIG. 7, each of the two windings 70 has a central axis L of the winding 70 at the winding center. The direction in which the central axis L extends is defined as the axial direction Y of the windings 70. The two windings 70 are wound around the core 50 such that the central axes L are parallel to each other. The two windings 70 are arranged side by side in an arrangement direction X. The arrangement direction X coincides with the direction in which the two linear sections 51 are arranged. Accordingly, the common-mode choke coil 34 is wound around the core 50 and includes the two windings 70, which are arranged side by side in the arrangement direction X.

As shown in FIGS. 5 and 6, each winding 70 includes a first coil portion 71 wound around the linear section 51. In the present embodiment, each winding 70 is also wound around part of the two arcuate sections 52. Each winding 70 includes two second coil portions 72 wound around the two arcuate sections 52, respectively. The two second coil portions 72 are located on opposite sides of the first coil portion 71. Each winding 70 includes two lead portions 73 that are drawn out of the second end face 50*b* of the core 50. The core 50 includes a non-winding portion 53 that is free of the winding 70. The non-winding portion 53 of the present embodiment is a portion of each arcuate section 52 that is free of the winding 70.

The insulating member 60 includes two core insulators 61, a winding insulator 62, and four connecting portions 63.

The core insulators 61 are annular. The two core insulators 61 cover parts of the core 50 around which the windings 70 are wound. Each core insulator 61 includes a first cover 61*a* that covers the entirety of each linear section 51, and second covers 61*b* that are respectively located on opposite sides of the first cover 61*a* and cover parts of the two arcuate sections 52. The two windings 70 are wound around the core 50 to which the insulating member 60 is coupled. The two core insulators 61 are arranged between the core 50 and the two windings 70. The two core insulators 61 insulate the two windings 70 from the core 50. The non-winding portion 53 of the core 50 is not covered by the insulating member 60.

The winding insulator 62 has the shape of a flat plate. The winding insulator 62 is located inside the core 50. The winding insulator 62 is located between the first winding 701 and the second winding 702. The winding insulator 62 insulates the second winding 702 from the first winding 701. The dimension of the winding insulator 62 in the axial direction of the core 50 is greater than the dimension of each winding 70 in the axial direction of the core 50.

The four connecting portions 63 connect the two core insulators 61 to the winding insulator 62. The four connecting portions 63 integrate the two core insulators 61 with the winding insulator 62.

As shown in FIG. 7 and FIG. 8, the insulating member 60 includes a first segment 60*a* and a second segment 60*b* into which the insulating member 60 is split in the axial direction of the core 50. The first segment 60*a* is coupled to the core 50 so as to cover the first end face 50*a* of the core 50. The second segment 60*b* is coupled to the core 50 so as to cover the second end face 50*b* of the core 50.

Conductor

As shown in FIGS. 4 and 7, the conductor 80 is annular. In other words, the conductor 80 has the shape of an endless loop. As shown in FIG. 5, the conductor 80 includes a first metal plate 81 and a second metal plate 92 into which the conductor 80 is split in a direction orthogonal to the axial direction Y and the arrangement direction X of the winding 70. Brass with a tin-plated surface is used as the material for the first metal plate 81 and the second metal plate 92. The tin plating is intended for corrosion resistance. The thickness of the first metal plate 81 is uniform. The thickness of the second metal plate 92 is uniform. The thickness of the first metal plate 81 and the thickness of the second metal plate 92 may be equal to each other or may be different from each other.

The first metal plate 81 includes a body 83 and two extensions 84. The body 83 has the shape of an elongated rectangular plate. The two extensions 84 extend in the thickness direction of the body 83 from two longitudinal ends of the body 83. The two extensions 84 extend parallel to each other. Each extension 84 has the shape of an elongated rectangular plate. The first metal plate 81 is formed by pressing a single metal plate.

Each extension 84 has a tip including a connecting plate portion 85. The connecting plate portion 85 is provided at a middle portion of the extension 84 in the lateral direction of extension 84. The connecting plate portion 85 extends in parallel to the extension 84 from the tip of the extension 84. The connecting plate portion 85 includes a connecting plate portion outer surface 85*a* and a connecting plate portion inner surface 85*b*, which are located on the opposite sides of the connecting plate portion 85 in the thickness direction of the connecting plate portion 85. The connecting plate portion outer surface 85*a* is also the outer surface of the extension 84. The connecting plate portion inner surface 85*b* is also the inner surface of the extension 84.

The entire second metal plate 92 has the shape of a rectangular frame. The second metal plate 92 includes two opposing portions 94 having the shape of an elongated rectangular plate, and two coupling portions 93, each coupling the two opposing portions 94 to each other and having the shape of an elongated rectangular plate. The two opposing portions 94 face each other in their thickness direction, and the coupling portions 93 face each other in their thickness direction. The central axis of the rectangular frame defined by the second metal plate 92 extends in a direction that coincides with the lateral direction of the coupling portions 93 and the opposing portions 94. Accordingly, the second metal plate 92 has the shape of a rectangular frame including the two opposing portions 94 and the two coupling portions 93, each coupling the two opposing portions 94 to each other. Each opposing portion 94 includes an opposing portion outer surface 94*a* and an opposing portion inner surface 94*b*, which are located on opposite sides of the opposing portion 94 in the thickness direction of the opposing portion 94. Each coupling portion 93 includes a coupling portion outer surface 93*a* and a coupling portion inner surface 93*b*, which are located on opposite sides of the coupling portion 93 in the thickness direction of the coupling portion 93. The coupling portion outer surfaces 93*a* and the opposing portion outer surfaces 94*a* define the outer surface of the second metal plate 92. The coupling portion inner surfaces 93*b* and the opposing portion inner surfaces 94*b* define the inner surface of the second metal plate 92.

As shown in FIG. 7, the second metal plate 92 is located between the connecting plate portions 85 of the two extensions 84 of the first metal plate 81. The direction in which the two extensions 84 extend from the body 83 is the same as the lateral direction of the coupling portions 93 and the opposing portions 94. The two opposing portions 94 are each overlapped with the connecting plate portion 85 of the corresponding extension 84. The two opposing portions 94 are each welded to the connecting plate portion 85 of the corresponding extension 84. Specifically, the opposing portion outer surface 94*a* of the opposing portion 94 and the connecting plate portion inner surface 85*b* of the connecting plate portion 85 are welded to each other. Thus, the conductor 80 includes a weld portion 99 where each opposing portion 94 and the corresponding extension 84 are welded to each other. In the present embodiment, the two opposing portions 94 and the two extensions 84 are respectively joined to each other through resistance welding. Thus, the conductor 80 is integrated by respectively joining the two extensions 84 to the corresponding opposing portions 94, and has the shape of a rectangular frame as viewed from the front. The two coupling portions 93 extend in the arrangement direction X between the two extensions 84.

The above-described conductor 80 surrounds the two windings 70. In the conductor 80, the first metal plate 81 includes the body 83, which is located on a side of the two windings 70 opposite to the second metal plate 92, and the two extensions 84, which extend from the body 83 toward the second metal plate 92. In the conductor 80, the second metal plate 92 includes the two opposing portions 94, which are respectively opposed to the connecting plate portions 85 of the two extensions 84, and at least one coupling portion 93, which couples the two opposing portions 94 to each other.

As shown in FIG. 8, the two coupling portions 93 each include the coupling portion outer surface 93*a* and the coupling portion inner surface 93*b*, which are orthogonal to the axial direction Y, in which the central axis L of each winding 70 extends. The two coupling portions 93 are spaced apart from each other in the axial direction Y of the windings 70. Thus, the first coil portions 71 of the two windings 70 are exposed toward the outer surface 15*c* of the end wall 15*a* from between the two coupling portions 93. Further, the two coupling portions 93 are located at the corresponding boundary between the first coil portion 71 and the two second coil portions 72. Accordingly, the entirety of each first coil portion 71 faces the outer surface 15*c* of the end wall 15*a*. As long as the two coupling portions 93 are spaced apart from each other in the axial direction Y, the positions of the two coupling portions 93 may be changed.

In addition, the two opposing portions 94 connect the two coupling portions 93 to each other in the axial direction Y. Accordingly, the second metal plate 92 has the shape of a rectangular frame including the coupling portions 93, which are spaced apart from each other in the axial direction Y, and the two opposing portions 94, which connect the coupling portions 93 to each other in the axial direction Y.

As shown in FIGS. 3 and 8, a thickness D1 of each coupling portion 93 is smaller than an opening width W of the groove 151 at a long groove portion 151*a*. While the thickness D1 is approximately one-tenth of the opening width W, this ratio may be changed. Additionally, a dimension G of each coupling portion 93 in its lateral direction is smaller than a depth F of the groove 151 at the long groove portion 151*a*.

Additionally, as shown in FIGS. 3 and 7, a total thickness D2, which is the sum of the thickness of the connecting plate portion 85 and the thickness of the opposing portion 94, is smaller than the opening width W of the groove 151 at the short groove portion 151*b*. A dimension G of the opposing portion 94 in its lateral direction is smaller than the depth F of the groove 151 at the short groove portion 151*b*.

As shown in FIG. 7, the view of the conductor 80 in the axial direction Y of the winding 70 is referred to as the front view of the conductor 80. In the front view of the conductor 80, the conductor 80 has the shape of a rectangular frame. The direction in which the central axis of the rectangular frame defined by the conductor 80 extends is defined as the axial direction of the conductor 80. The axial direction of the conductor 80 coincides with the direction in which the two linear sections 51 of the core 50 extend, and coincides with the axial direction Y of the winding 70.

The two linear sections 51 of the core 50 and the first coil portion 71 of each winding 70 are located inside the rectangular frame of the conductor 80. The two arcuate sections 52 of the core 50 and the two second coil portions 72 of each winding 70 are located on the opposite sides of the conductor 80 in the axial direction of the conductor 80, respectively. That is, the two arcuate sections 52 of the core 50 and the two second coil portions 72 of each winding 70 are located outside the conductor 80.

Arrangement of Common-Mode Choke Coil

The axial direction of the core 50 coincides with the thickness direction of the plate portion 39*a* and the axial direction of the tubular portion 39*b*. The first end face 50*a* of the core 50 faces the side on which the end wall 15*a* of the suction housing member 15 is located. The second end face 50*b* of the core 50 faces the side on which the plate portion 39*a* is located. The two lead portions 73 of each winding 70 extend through the plate portion 39*a*, and the two extended lead portions 73 are, for example, soldered to the circuit board 29. Thus, the common-mode choke coil 34 is electrically connected to the circuit board 29.

The common-mode choke coil 34 and the conductor 80 are accommodated in the space surrounded by the plate portion 39*a* and the tubular portion 39*b* of the holder 39, at a location between the circuit board 29 and the end wall 15*a* of the housing 14.

The body 83 of the conductor 80 is located between the first coil portions 71 of the two windings 70 and the plate portion 39*a*. The portion of each core insulator 61 that covers the first end face 50*a* of the core 50 is located on a side of the first coil portion 71 of each winding 70 opposite to the circuit board 29. The two extensions 84 of the conductor 80 extend from the body 83 toward the end wall 15*a* on the outside of the two windings 70 in the arrangement direction X, and externally cover the two windings 70 in the arrangement direction X. The two connecting plate portions 85 each extend from the corresponding extension 84 toward the end wall 15*a* of the suction housing member 15. The second metal plate 92 is located between the first coil portions 71 of the two windings 70 and the end wall 15*a*.

As shown in FIGS. 7 and 8, the groove 151 in the end wall 15*a* has the shape of a rectangular frame opening toward the second metal plate 92. In other words, the groove 151 has the shape of a rectangular frame shape opening toward the common-mode choke coil 34. Additionally, the groove 151 is filled with thermal grease 56, which is a heat dissipation material. The second metal plate 92 is inserted into the groove 151. Specifically, the two coupling portions 93 are each inserted into the corresponding long groove portion 151*a*, and the two opposing portions 94 and the connecting plate portions 85 of the extensions 84 are each inserted into the corresponding short groove portion 151*b*. Thus, the weld portion 99 between the opposing portion 94 and the extension 84 is inserted into the short groove portion 151*b*. The longitudinal direction and the thickness direction of the coupling portion 93 coincide with the longitudinal direction and the lateral direction of the long groove portion 151*a*, respectively. Additionally, the longitudinal direction and the thickness direction of the opposing portion 94 coincide with the longitudinal direction and the lateral direction of the short groove portion 151*b*, respectively. The width of the long groove portion 151*a* in its lateral direction and the width of the short groove portion 151*b* in its lateral direction are equal to the opening width W of the groove 151.

The thermal grease 56 is provided between each winding 70 (specifically, the first and second coil portions 71 and 72) and the end wall 15*a*. The thermal grease 56 is provided inside the rectangular frame defined by the second metal plate 92. This allows the winding 70 and the end wall 15*a* (i.e., the housing 14) to be electrically insulated from each other by the thermal grease 56 and transfer heat to each other via the thermal grease 56.

In the following description, among the inner side surfaces 151*d* of the groove 151, the inner side surface 151*d* located on the outer circumferential side of the groove 151 is referred to as a first inner side surface 151*d*1, and the inner side surface 151*d* located on the inner circumferential side of the groove 151 is referred to as a second inner side surface 151*d*2. The first inner side surface 151*d*1 faces the coupling portion outer surface 93*a*, the opposing portion outer surface 94*a*, and the connecting plate portion outer surface 85*a*. The second inner side surface 151*d*2 faces the coupling portion inner surface 93*b* and the opposing portion inner surface 94*b*.

The thermal grease 56, which is a heat dissipation material, is provided between the first inner side surface 151*d*1 and the coupling portion outer surface 93*a* and between the second inner side surface 151*d*2 and the coupling portion inner surface 93*b*. Thus, the coupling portion 93 is spaced apart from the two inner side surfaces 151*d* and inserted into the groove 151, with the two surfaces of the coupling portion 93 in the thickness direction of the coupling portion 93 facing the inner side surfaces 151*d* of the groove 151 via the thermal grease 56.

The thermal grease 56, which is a heat dissipation material, is provided between the first inner side surface 151*d*1 and the connecting plate portion outer surface 85*a* and between the second inner side surface 151*d*2 and the opposing portion inner surface 94*b*. Thus, the connecting plate portion 85 and the opposing portion 94 are spaced apart from the two inner side surfaces 151*d* and inserted into the groove 151, while facing the inner side surfaces 151*d* of the groove 151 via the thermal grease 56. Accordingly, the weld portion 99 between the extension 84 and the opposing portion 94 is also inserted into the thermal grease 56.

As shown in FIG. 3, the second metal plate 92 is inserted into the groove 151 such that the shortest distance between the first inner side surface 151*d*1 and the coupling portion outer surface 93*a* and between the second inner side surface 151*d*2 and the coupling portion inner surface 93*b* is a first distance M1. Further, the second metal plate 92 is inserted into the groove 151 such that the shortest distance between the first inner side surface 151*d*1 and the connecting plate portion outer surface 85*a* and between the second inner side surface 151*d*2 and the opposing portion inner surface 94*b* is a second distance M2. The opening width W of the groove 151 remains unchanged at any position in the groove 151. Thus, the second distance M2 is shorter than the first distance M1.

As shown in FIG. 8, the shortest distance between the first coil portion 71 of the winding 70 and the outer surface 15*c* of the end wall 15*a* is defined as a separation distance N. Each of the first distance M1 and the second distance M2 is shorter than the separation distance N. Thus, the coupling portion outer surface 93*a* and the coupling portion inner surface 93*b* are arranged closer to the end wall 15*a* than to the first coil portion 71. Similarly, the connecting plate portion outer surface 85*a*, the opposing portion outer surface 94*a*, and the opposing portion inner surface 94*b* are arranged closer to the end wall 15*a* than to the first coil portion 71.

The second metal plate 92 is inserted into the groove 151 such that the coupling portions 93 is located at a middle part of the long groove portion 151*a* in the lateral direction of the long groove portion 151*a*. Thus, the first distance M1 on the opposite sides of the coupling portion 93 remains unchanged. The second metal plate 92 is inserted into the groove 151 such that the connecting plate portion 85 and the opposing portion 94 are located at a middle part of the short groove portion 151*b* in the lateral direction of the short groove portion 151*b*. Thus, the second distance M2 on the opposite sides of the connecting plate portion 85 and the opposing portion 94 remains unchanged.

Operation of Embodiment

The operation of the embodiment will now be described.

The noise reducing unit 32 includes the conductor 80, which surrounds the two windings 70 of the common-mode choke coil 34. When a normal-mode current flows through the two windings 70, a leakage magnetic flux is generated from the core 50. Thus, an induced current flows through the conductor 80 in the circumferential direction of the conductor 80 to resist changes in the leakage magnetic flux from the core 50. In other words, the induced current flows through the first metal plate 81 and the second metal plate 92. Thus, the induced current also flows through the weld portion 99, the coupling portion 93, and the opposing portion 94. Then, the induced current flowing through the conductor 80 is converted into thermal energy, thereby producing a damping effect. As a result, the resonance peak of the low-pass filter is suppressed.

When the induced current flows through the conductor 80, the conductor 80 generates heat. Specifically, the first metal plate 81 and the second metal plate 92 of the conductor 80 generate heat, and the weld portion 99 also generates heat. The heat generated from the weld portion 99 is transferred from the opposing portion 94 to the coupling portion 93. Thus, when the induced current flows through the conductor 80, the weld portion 99 and the coupling portion 93 generate heat.

The heat generated from the weld portion 99 is transferred to the inner side surface 151*d*, which defines the short groove portion 151*b*, through the thermal grease 56 from the connecting plate portion outer surface 85*a* and the opposing portion inner surface 94*b*. Additionally, the heat generated from the coupling portion 93 is transferred to the inner side surface 151*d*, which defines the long groove portion 151*a*, through the thermal grease 56 from the coupling portion outer surface 93*a* and the coupling portion inner surface 93*b*. Thus, the suction housing member 15 includes the groove 151, in which the weld portion 99 and the coupling portion 93 are arranged. In the groove 151, the thermal grease 56 is provided to transfer heat generated from the weld portion 99 and the coupling portion 93 to the suction housing member 15. The induced current flows through the weld portion 99 and the coupling portion 93, which are arranged in the groove 151.

When the current flows through the two windings 70, the two windings 70 generate heat. The heat from the first coil portions 71 of the two windings 70 is transferred to the suction housing member 15 through the thermal grease 56.

Advantages of Present Embodiment

The advantages of the present embodiment will now be described.

(1) The weld portion 99 and the coupling portion 93 of the conductor 80 are arranged in the groove 151 of the suction housing member 15, and the thermal grease 56 is provided in the groove 151. When an induced current flows through the conductor 80 so that the conductor 80 generates heat, the weld portion 99 also generates heat. Additionally, the heat from the weld portion 99 is transferred to the coupling portion 93, which is coupled to the weld portion 99. The heat generated from the weld portion 99 and the coupling portion 93 is dissipated to the suction housing member 15 through the thermal grease 56. Thus, the motor-driven compressor 11 improves the heat dissipation performance of the conductor 80, in which the first metal plate 81 and the second metal plate 92 are joined to each other at the weld portion 99.

(2) The second metal plate 92 has the shape of a rectangular frame including the two opposing portions 94 and the two coupling portions 93, each coupling the two opposing portions 94 to each other. For example, compared to when there is only one coupling portion 93, an area available for heat dissipation from the coupling portion 93 is larger. As a result, compared to when there is only one coupling portion 93, the heat dissipation performance of the second metal plate 92 is improved.

(3) Each of the first distance M1 and the second distance M2, which are from the second metal plate 92 to the two inner side surfaces 151*d* of the groove 151, is set to be smaller than the separation distance N, which is from the winding 70 to the end wall 15*a* of the suction housing member 15. This increases the effect of heat dissipation to the end wall 15*a* from the second metal plate 92, and consequently, from the weld portion 99 and the coupling portion 93.

(4) The coupling portion 93 is inserted into the groove 151 such that the first distances M1 between the coupling portion 93 and the inner side surface 151*d* of the groove 151 on the opposite sides of the coupling portion 93 in the thickness direction of the coupling portion 93 are equal to each other. This allows the heat generated from the coupling portion 93 to be dissipated in the same manner from both the coupling portion outer surface 93*a* and the coupling portion inner surface 93*b* to the corresponding inner side surface 151*d* of the groove 151. Additionally, due to component tolerances or the like, the first distance M1 between the first inner side surface 151*d*1 and the coupling portion outer surface 93*a* may differ from the first distance M1 between the second inner side surface 151*d*2 and the coupling portion inner surface 93*b*. Even in such a case, of the coupling portion outer surface 93*a* and the coupling portion inner surface 93*b*, the surface in which the first distance M1 is relatively short compensates for a decrease in the heat dissipation performance caused by the surface in which the first distance M1 is relatively long. This facilitates efficient heat dissipation from the coupling portion 93.

(5) The connecting plate portion 85 and the opposing portion 94 are inserted into the groove 151 such that the second distance M2 between the connecting plate portion outer surface 85*a* and the first inner side surface 151*d*1 is equal to the second distance M2 between the opposing portion inner surface 94*b* and the second inner side surface 151*d*2. This allows the heat generated from the weld portion 99 to be dissipated in the same manner from both the connecting plate portion outer surface 85*a* and the opposing portion inner surface 94*b* to the corresponding inner side surface 151*d* of the groove 151. Additionally, due to component tolerances or the like, the second distance M2 between the first inner side surface 151*d*1 and the connecting plate portion outer surface 85*a* may differ from the second distance M2 between the second inner side surface 151*d*2 and the opposing portion inner surface 94*b*. Even in such a case, of the connecting plate portion outer surface 85*a* and the opposing portion inner surface 94*b*, the surface in which the second distance M2 is relatively short compensates for a decrease in the heat dissipation performance caused by the surface in which the second distance M2 is relatively long. This facilitates efficient heat dissipation from the weld portion 99.

(6) The second metal plate 92 has the shape of a rectangular frame including the two opposing portions 94 and the two coupling portions 93. For example, compared to when the second metal plate 92 couples two opposing portions 94 to a single coupling portion 93, the strength of the second metal plate 92, and as a result, the strength of the conductor 80, are greater.

Modifications

The above-described embodiment may be modified as described below. The above-described embodiment and the following modifications can be combined as long as there is no technical contradiction.

The thermal dissipation material is not limited to the thermal grease 56. Instead, the thermal dissipation material may be, for example, a thermal paste or a thermal filler.

The coupling portion 93 may be inserted into the groove 151, with the first distance M1 being different on the opposite sides of the coupling portion 93 in the thickness direction. Further, the connecting plate portion 85 and the opposing portion 94 may be inserted into the groove 151, with the second distance M2 being different on their opposite sides in the thickness direction.

Instead of a brass plate, the conductor 80 may be formed by, for example, an aluminum plate or a stainless steel plate.

The connecting plate portion 85 does not have to be provided on the extension 84.

Each of the first distance M1 and the second distance M2 from the second metal plate 92 to the inner side surface 151*d* of the groove 151 may be greater than or equal to the separation distance N from the winding 70 to the end wall 15*a* of the suction housing member 15.

The groove 151 and the second metal plate 92 do not necessarily need to have the shape of a rectangular frame. For example, the second metal plate 92 may have an H-shaped configuration with two opposing portions 94 and a single coupling portion 93 that couples the two opposing portions 94 to each other. In this case, the groove 151 includes two first groove formation portions that accommodate the two opposing portions 94 and the connecting plate portion 85, and a second groove formation portion that couples the two groove formation portions to each other and extends linearly so as to accommodate a single coupling portion 93.

Alternatively, the second metal plate 92 may be shaped so as to include two opposing portions 94 and three or more coupling portions 93 that couple the two opposing portions 94 to each other. In this case, the groove 151 includes two first groove formation portions that accommodate the two opposing portions 94 and the connecting plate portion 85, and a second groove formation portion that couples the two groove formation portions to each other and extends linearly so as to accommodate three or more coupling portions 93.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A motor-driven compressor, comprising:
a compression unit configured to compress fluid;
an electric motor configured to drive the compression unit;
an inverter device configured to drive the electric motor; and
a metal housing that accommodates the compression unit, the electric motor, and the inverter device, wherein
the inverter device includes:
an inverter circuit unit configured to convert DC power to AC power; and
a noise reducing unit arranged on an input side of the inverter circuit unit and configured to reduce common-mode noise and normal-mode noise, the common-mode noise and normal-mode noise being included in the DC power that is input to the inverter circuit unit,
the noise reducing unit includes:
a common-mode choke coil; and
a smoothing capacitor that forms a low-pass filter together with the common-mode choke coil,
the common-mode choke coil includes:
an annular core;
two windings wound around the core, and
an annular conductor that surrounds the two windings, the conductor being configured such that an induced current flows circumferentially to resist changes in a leakage magnetic flux from the core,
the conductor includes a first metal plate and a second metal plate,
the first metal plate includes:
a body arranged on a side of the two windings opposite to the second metal plate; and
two extensions extending from the body toward the second metal plate, the second metal plate includes:
two opposing portions respectively opposed to the two extensions; and
a coupling portion that couples the two opposing portions to each other,
the conductor includes weld portions in which the opposing portions are respectively welded to the extensions,
the housing has a groove in which each of the weld portions and the coupling portion are arranged,
a heat dissipation material is provided in the groove to transfer heat generated from the weld portion and the coupling portion to the housing, and
the induced current flows through the weld portion and the coupling portion arranged in the groove.

2. The motor-driven compressor according to claim 1, wherein
the coupling portion is one of two coupling portions,
the second metal plate has a shape of a rectangular frame including the two opposing portions and the two coupling portions, each of the two coupling portions coupling the two opposing portions to each other,
the groove has a shape of a rectangular frame opening toward the second metal plate, and
the second metal plate is located in the groove.

3. The motor-driven compressor according to claim 1, wherein a shortest distance between the second metal plate and an inner side surface of the groove is smaller than a shortest distance between each of the windings and the housing.

* * * * *